United States Patent
Wirth

(10) Patent No.: US 8,624,269 B2
(45) Date of Patent: Jan. 7, 2014

(54) RADIATION-EMITTING THIN-FILM SEMICONDUCTOR CHIP AND METHOD OF PRODUCING A RADIATION-EMITTING THIN FILM SEMICONDUCTOR CHIP

(75) Inventor: Ralph Wirth, Mintraching-Auhof (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 61 days.

(21) Appl. No.: 12/989,470

(22) PCT Filed: Apr. 9, 2009

(86) PCT No.: PCT/DE2009/000509
§ 371 (c)(1),
(2), (4) Date: Feb. 9, 2011

(87) PCT Pub. No.: WO2009/132614
PCT Pub. Date: Nov. 5, 2009

(65) Prior Publication Data
US 2011/0121322 A1    May 26, 2011

(30) Foreign Application Priority Data
Apr. 30, 2008    (DE) .......................... 10 2008 021 620

(51) Int. Cl.
*H01L 27/15* (2006.01)

(52) U.S. Cl.
USPC .................. 257/84; 257/14; 257/17; 438/455; 438/26; 372/50.12; 372/23; 372/97

(58) Field of Classification Search
USPC ................ 257/14, 17, 84; 372/23, 46, 50, 97
See application file for complete search history.

(56) References Cited

U.S. PATENT DOCUMENTS

| | | | |
|---|---|---|---|
| 5,319,655 A | | 6/1994 | Thornton |
| 5,869,903 A | * | 2/1999 | Nakatani et al. .............. 257/777 |
| 5,877,038 A | | 3/1999 | Coldren et al. |
| 5,999,553 A | * | 12/1999 | Sun ............................ 372/50.12 |
| 2005/0266588 A1 | | 12/2005 | Stauss |
| 2007/0025850 A1 | | 2/2007 | Meacham |
| 2007/0111473 A1 | * | 5/2007 | Furukawa et al. ............ 438/455 |
| 2008/0073658 A1 | * | 3/2008 | Wirth .............................. 257/96 |

FOREIGN PATENT DOCUMENTS

| | | |
|---|---|---|
| DE | 10 2004 026 125 | 12/2005 |
| EP | 1 536 479 | 6/2005 |
| EP | 1 879 238 | 1/2008 |
| GB | 2 366 074 | 2/2002 |
| JP | 06-224518 | 8/1994 |
| JP | 2003-158296 | 5/2003 |
| WO | WO 2005/055379 | 6/2005 |
| WO | WO 2008/043324 | 4/2008 |

* cited by examiner

*Primary Examiner* — Jay C Kim
*Assistant Examiner* — Bo Fan
(74) *Attorney, Agent, or Firm* — Cozen O'Connor

(57) ABSTRACT

A radiation-emitting thin film semiconductor chip is herein described which comprises a first region with a first active zone, a second region, separated laterally from the first region by a space, with a second active zone which extends parallel to the first active zone in a different plane, and a compensating layer, which is located in the second region at the level of the first active zone, the compensating layer not containing any semiconductor material.

3 Claims, 6 Drawing Sheets

RADIATION-EMITTING THIN-FILM SEMICONDUCTOR CHIP AND METHOD OF PRODUCING A RADIATION-EMITTING THIN FILM SEMICONDUCTOR CHIP

RELATED APPLICATIONS

This is a U.S. national stage of application No. PCT/DE2009/000509 filed on Apr. 9, 2009.

This application claims the priority of German application no. 10 2008 021 620.8 filed Apr. 30, 2008, the entire content of which is hereby incorporated by reference.

FIELD OF THE INVENTION

The present invention relates to a radiation-emitting thin film semiconductor chip and a method of producing a radiation-emitting thin film semiconductor chip.

BACKGROUND OF THE INVENTION

Published patent application WO 2005/055379 describes a light-emitting semiconductor component which contains a semiconductor layer sequence with a region of p-doped semiconductor layers and n-doped semiconductor layers, between which a first pn-junction is formed. The pn-junction is subdivided in the lateral direction by an insulating portion into a light-emitting portion and a protection diode portion. In the region of the protection diode portion an n-doped layer is applied to the p-doped region, the n-doped layer forming a second pn-junction functioning as a protection diode with the p-doped region. With this semiconductor component two pn-junctions are thus necessary in the protection diode portion. Furthermore, the first pn-junction has to have a larger area in the protection diode portion than the first pn-junction in the light-emitting portion.

SUMMARY OF THE INVENTION

One object of the invention is to provide a structurally simply configured thin film semiconductor chip with various functional regions. Another object is to provide a method with which a radiation-emitting thin film semiconductor chip with various functional regions may be simply produced.

According to a preferred embodiment the radiation-emitting thin film semiconductor chip comprises a first region with a first active zone, a second region, separated laterally from the first region by a space, with a second active zone which extends parallel to the first active zone in a different plane, and a compensating layer, which is located in the second region at the level of the first active zone, the compensating layer not containing any semiconductor material.

Laterally here means a direction which runs parallel to the planes in which the active zones extend.

The difference in level between the top of the second region and the top of the first region may be suitably adjusted by means of the compensating layer. The difference in level may in particular be compensated. No complex growth of a semiconductor layer is needed for this purpose. Instead, the compensating layer may for example be applied by vapour-deposition or sputtering by using a material other than a semiconductor material. The second active zone and the compensating layer preferably adjoin one another directly.

The two laterally separated regions may advantageously differ from one another with regard to their technical functions, such that advantageously the integration density in the component—more functions on a smaller area—may be increased. This is because, in contrast to a conventional component, which comprises a plurality of chips for different functions, in this case a single chip may be used for a plurality of functions.

According to a preferred embodiment the thickness of the compensating layer corresponds to the thickness of the first active zone. By means of the compensating layer the two regions are at the same level on a first side of the thin film semiconductor chip. This has the advantage that the two regions may be arranged simply on a common planar carrier.

In one advantageous variant of the radiation-emitting thin film semiconductor chip the first region is a radiation-producing region, wherein the first active zone is intended to produce radiation of a first wavelength. Preferably, the first wavelength is within the visible spectrum.

The active zone comprises a pn-junction, which is formed in the simplest case of a p-conducting and an n-conducting semiconductor layer, which directly adjoin one another. Preferably, the actual radiation-producing layer is provided between the p-conducting and n-conducting semiconductor layers, for instance in the form of a doped or undoped quantum layer. The quantum layer may take the form of a single quantum well structure (SQW) or multiple quantum well structure (MQW) or indeed of a quantum wire or quantum dot structure.

In addition, the second region may also be a radiation-producing region, wherein the second active zone may be intended to produce radiation of a second wavelength. Preferably, the second wavelength is also within the visible spectrum.

Advantageously, a thin film semiconductor chip with two regions producing different coloured radiation may illuminate an area accordingly in different colours if the two regions are operated simultaneously. The colour contrast arising in this case may be used for example to display symbols.

Alternatively, the regions may be operated one after the other, such that light of a first colour is emitted when the first region is operated and light of a second colour is emitted when the second region is operated. Such a semiconductor chip may for example be used in a flashing display inside a vehicle, such that on actuation of the flashing light the light of the first colour and on actuation of the hazard warning system the light of the second colour is emitted.

According to a further embodiment the second region may be a protection region for protecting the first region from voltage surges or inadmissible voltages. In particular, the second active zone may comprise a pn-junction, in which the sequence of p-conducting and n-conducting semiconductor layers is switched relative to the sequence in the first active zone.

In another variant the second region takes the form of a radiation-receiving region for detecting radiation. This makes it possible to monitor the radiant power of the first region and optionally to adjust it accordingly.

The compensating layer arranged at the level of the first active zone preferably contains an electrically conductive material, such that the second active zone may be electrically contacted by means of the compensating layer.

The compensating layer may in particular contain a metal or a TCO (transparent conductive oxide). The TCO is a transparent, conductive material, in particular a metal oxide such as for example zinc oxide, tin oxide, cadmium oxide, titanium oxide, indium oxide or indium-tin oxide (ITO). In addition to binary metal-oxygen compounds, such as for example ZnO, $SnO_2$ or $In_2O_3$, the group of TCOs also includes ternary metal-oxygen compounds, such as for example $Zn_2SnO_4$, $CdSnO_3$, $ZnSnO_3$, $MgIn_2O_4$, $GaInO_3$, $Zn_2In_2O_5$ or In$_4$Sn$_3$O$_{12}$ or mixtures of different transparent conductive oxides. Furthermore, TCOs do not necessarily correspond to a stoichiometric composition and may also be p- or n-doped.

The compensating layer arranged at the level of the first active zone may be connected to the first active zone by a contact layer, such that the two regions may be jointly electrically contacted on one side of the thin film semiconductor chip.

The second region may comprise an etch stop layer on a side of the second active zone facing the compensating layer. The etch stop layer prevents the first active zone from being affected when the second active zone is being structured.

Advantageously the etch stop layer is electrically conductive, such that it does not have to be removed after structuring but rather may be left in the finished semiconductor chip.

The space between the two regions may be provided with a dielectric material, such that the first active zone is electrically insulated from the second active zone. Thus fault currents between the two active zones may be prevented. Suitable dielectric materials are for example silicon nitrides, silicon oxynitrides and silicon oxides.

In a preferred variant of a method of producing a radiation-emitting thin film semiconductor chip first of all the second active zone is grown on a growth substrate. Then the first active zone is grown on the second active zone. This is followed by removal of the first active zone in the second region and detachment of the growth substrate. Finally the second active zone is removed in the first region in such a way that the two regions are separated laterally from one another by a space.

To produce the two active zones, therefore, no separately conducted growth processes are needed. The two active zones may be grown one over the other in a common growth process and then be structured in such a way that two separate functional regions with in each case one active zone arise.

The second active zone is preferably selectively removed in the first region by etching. The first active zone may accordingly be selectively removed in the second region by etching. In this case it is advantageous to arrange an etch stop layer between the first and second active zones, up to which the first active zone is etched away in the second region and the second active zone in the first region. It is thus possible to prevent the etching process from continuing into layers which are not to be etched.

In a preferred variant of the method a compensating layer is arranged on the second active zone after removal of the first active zone in the second region. As has already been mentioned above, the difference in level between the top of the second region and the top of the first region may be suitably adjusted by means of the compensating layer. The difference in level may in particular be compensated.

A carrier is advantageously arranged on the opposite side of the thin film semiconductor chip from the growth substrate before detachment of the growth substrate. The first and second regions may be stabilised thereby in the absence of the growth substrate.

DETAILED DESCRIPTION OF THE DRAWINGS

Figure 1A:
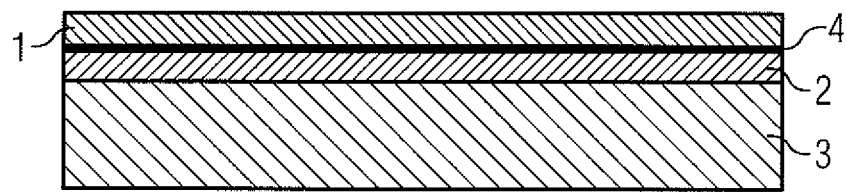
FIGS. 1A to 1F are schematic representations of various method steps of a first variant of a method of producing a thin film semiconductor chip.

Identical or identically acting elements are provided with identical reference numerals in the Figures.

FIG. 1A shows a first method step of a preferred variant of a method of producing a radiation-emitting thin film semiconductor chip.

A second active zone 2 is grown epitaxially onto a growth substrate 3. The second active zone 2 comprises a pn-junction, which is formed in the simplest case by a p-conducting and an n-conducting semiconductor layer, which adjoin one another. A first active zone 1 is grown epitaxially onto the second active zone 2, which first active zone 1, like the second active zone 2, comprises a pn-junction which is formed in the simplest case by a p-conducting and an n-conducting semiconductor layer which adjoin one another.

Preferably the first active zone 1 and the second active zone 2 are made from a material based on a phosphide compound semiconductor, which in this connection means that the active zones 1 and 2 preferably comprise Al$_n$Ga$_m$In$_{1-n-m}$P, wherein 0≤n≤1, 0≤m≤1 and n+m≤1. This material does not absolutely have to exhibit a mathematically exact composition according to the above formula. Instead, it may comprise one or more dopants and additional constituents which do not substantially modify the physical characteristics of the material. For simplicity's sake, however, the above formula includes only the fundamental constituents of the crystal lattice (Al, Ga, In, P), even if these may in part be replaced by small quantities of further substances. The first active zone 1 and the second active zone 2 particularly preferably contain InGaAlP.

If a material based on a phosphide-compound semiconductor is used for the two active zones 1 and 2, a material based on an arsenide compound semiconductor such as GaAs may advantageously be used for the growth substrate 3.

Figure 1B:
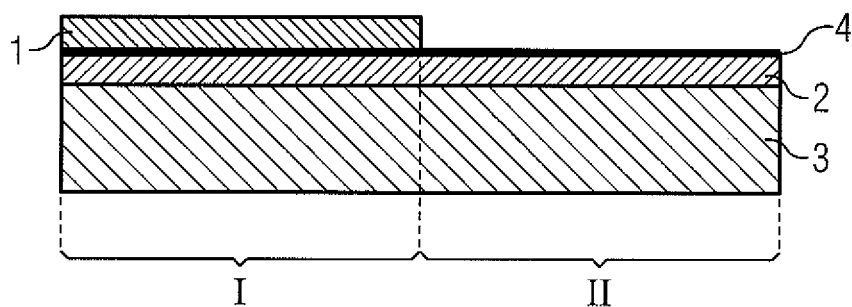

In a further method step the first active zone 1 is structured. In particular, the first active zone 1 is removed in a second region II, such that only the first region I continues to comprise the first active zone 1 (FIG. 1B). For example the first active zone 1 may be etched away in the second region II. In this case, an etch stop layer 4 may advantageously be provided between the first active zone 1 and the second active zone 2, which prevents the second active zone 2 from being etched at the same time as etching of the first active zone 1. If a material based on a phosphide-compound semiconductor is used for the two active zones 1 and 2, a material based on an arsenide compound semiconductor such as AlGaAs may be used for the etch stop layer 4.

Figure 1C:
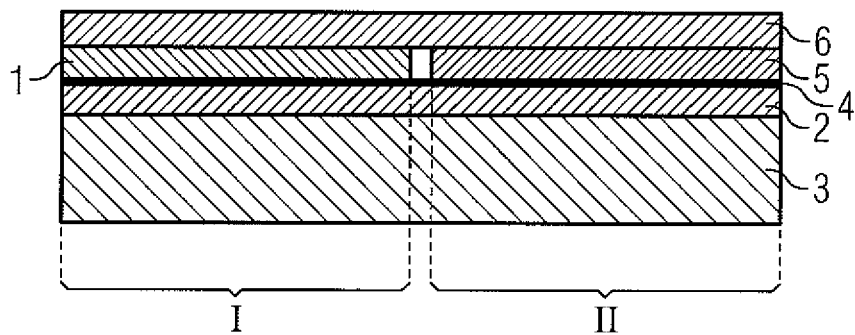

The exposed area, which arises through removal of the first active zone 1 in the second region II, may be covered by a compensating layer 5 (FIG. 1C). The compensating layer 5 is arranged in the second region II at the level of the first active zone 1. The thickness of the compensating layer 5 preferably corresponds to the thickness of the first active zone 1, such that the first region I and the second region II are at the same level on the opposite side from the growth substrate 3.

The compensating layer 5 is preferably electrically conductive, such that the second active zone 2 may be electrically contacted by means of the compensating layer 5. The compensating layer 5 may contain a metal such as Au or Al or a metal alloy such as AuZn or AuSn. For example, the compensating layer 5 may be applied to the second active zone 2 by vapour deposition or sputtering.

Figure 1D:
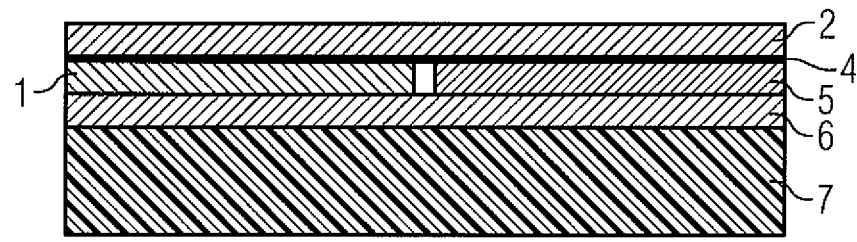

So that the second active zone 2 may also be structured, the assembly consisting of growth substrate 3, second active zone 2, structured first active zone 1 and compensating layer 5 is arranged on a carrier 7 on the opposite side from the growth substrate 3 and the growth substrate 3 is removed (FIG. 1D).

The assembly may be bonded to the carrier 7 by means of a contact layer 6. The contact layer 6 may for example contain a metal alloy such as AuZn, which is not only suitable for bonding but also comprises advantageous characteristics in terms of reflectivity and electrical conductivity.

Figure 1E:
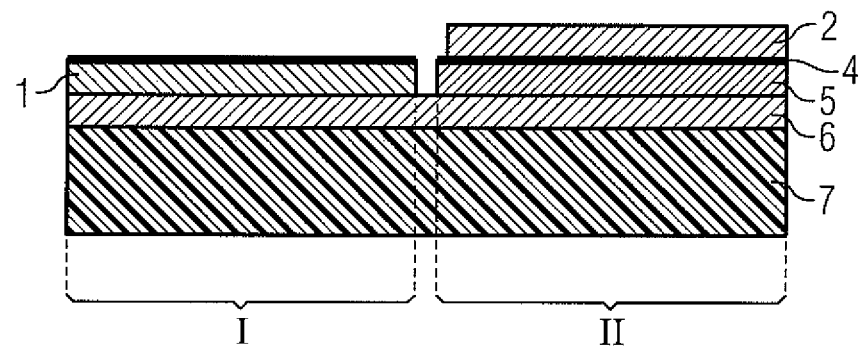

FIG. 1E shows a next method step, in which the second active zone 2 is structured. In particular, the second active zone 2 is removed in a first region I, such that only the second region II continues to comprise the second active zone. The second active zone 2 is preferably etched away in the first region I. The etch stop layer 4 may prevent the first active zone 1 from being etched at the same time.

Figure 1F:
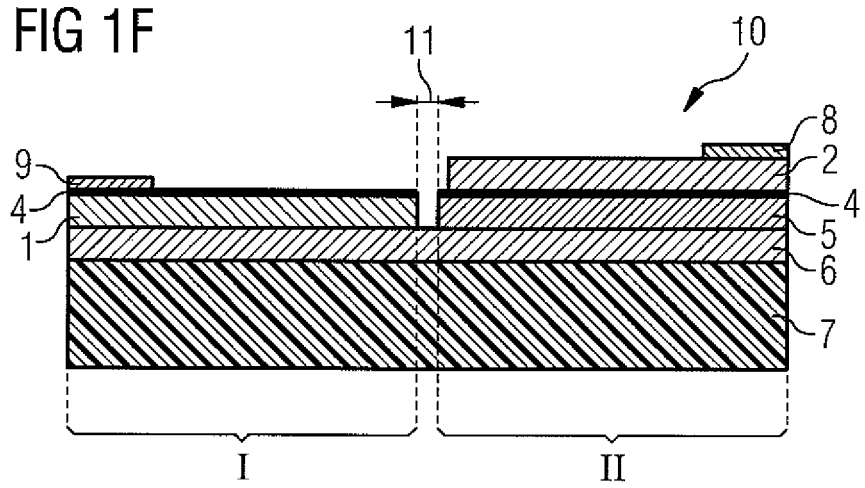

An electrically conductive material is advantageously used for the etch stop layer 4, such that the etch stop layer 4 may remain in the finished thin film semiconductor chip 10 (FIG. 1F). Finally, a contact metallization 9 is applied to the first active zone 1 and a contact metallization 8 is applied to the second active zone 2, whereby the first region I and the second region II are separately electrically contactable on the opposite side from the carrier 7.

The two regions I and II are separated laterally from one another by a space 11, such that fault currents may be avoided between the two regions I and II.

Advantageously, with the method as described in FIGS. 1A to 1F, the two active zones 1 and 2 may be structured by using thin film technology, i.e. by detaching the growth substrate 3 and transferring the assembly onto the carrier 7, such that ultimately there are two separate regions I and II with separate active zones 1 and 2.

By way of the method illustrated in FIGS. 1A to 1F it is possible to produce a radiation-emitting thin film semiconductor chip 10 as illustrated in FIG. 1F, comprising a first region I with a first active zone 1, a second region II, separated laterally by a space 11 from the first region I, with a second active zone 2 which extends parallel to the first active zone 1 in a different plane, and a compensating layer 5, which is located in the second region II at the level of the first active zone 1, the compensating layer 5 not containing any semiconductor material.

The two regions I and II may in particular be configured such that the active zones 1 and 2 emit radiation of different wavelengths within the visible spectrum. The thin film semiconductor chip 10 then emits light of different colours, whereby an area may be illuminated in different colours (cf. also FIGS. 3 to 5). Preferably, the opposite side from the carrier 7 is the radiation outcoupling side.

Figure 6:
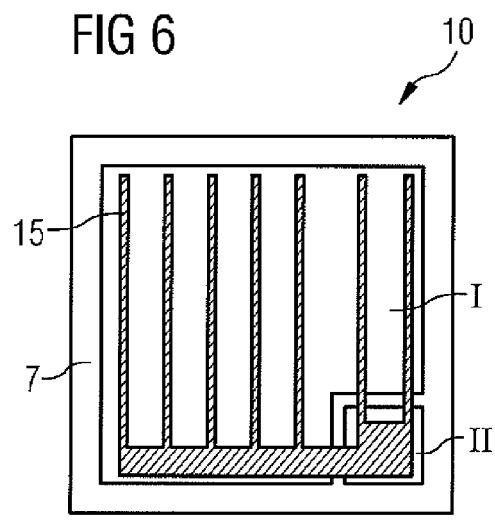

It is additionally possible for the first region I to take the form of a radiation-emitting region and the second region II to take the form of a protection region for protecting the first region I from voltage surges or inadmissible voltages (cf. also FIG. 6).

In a further variant the first region I is a radiation-emitting region and the second region II is a radiation-receiving region for detecting radiation.

FIGS. 2A to 2I show a further variant of a method according to the present application.

Figure 2A:
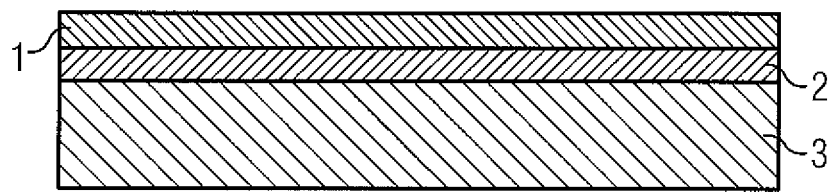
FIGS. 2A to 2I are schematic representations of various method steps of a second variant of a method of producing a thin film semiconductor chip.
Figure 2B:
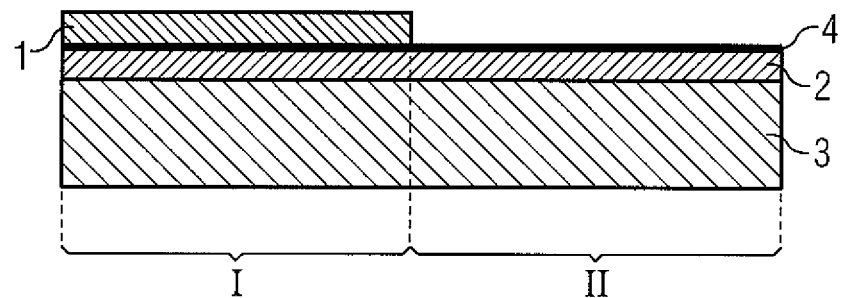

Firstly, a growth substrate 3 has a second active zone 2 grown onto it, onto which a first active zone 1 is in turn grown (FIG. 2A).

Then the first active zone 1 is structured on the opposite side from the growth substrate 3. This may take place as already described in relation to FIG. 1B.

Figure 2C:
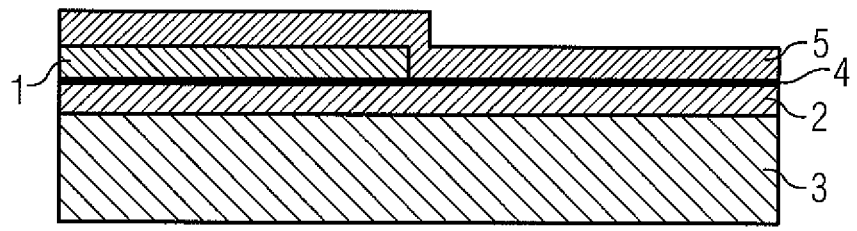
Figure 2D:
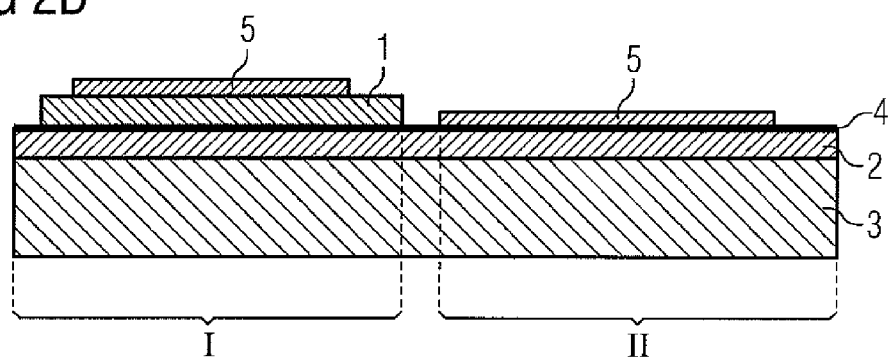

After removing the first active zone 1 in the second region II (FIG. 2B), a compensating layer 5 may be applied over the entire area of the opposite side from the growth substrate 3, such that on this side both the first active zone 1 and the second active zone 2 are covered by the compensating layer 5 (FIG. 2C). The compensating layer 5 preferably contains or consists of a TCO. The compensating layer 5 may for example be applied by sputtering.

The compensating layer 5 may be structured in a next step (FIG. 2D), such that if a TCO is used no electrical connection arises between the first active zone 1 and the second active zone 2. The compensating layer 5 may advantageously be used in the first region I as a current spreading layer. Likewise, the compensating layer 5 which is located in the second region II at the level of the first active zone 1 serves as a current spreading layer.

As a further measure for electrical insulation of the first region I from the second region II, the space 11 between the first region I and the second region II may be provided with a dielectric material 12 such as a silicon nitride, a silicon oxide or a silicon oxynitride. Furthermore, the dielectric material 12 may be applied in such a way that the compensating layer 5 is covered at the side surfaces in the first region I and in the second region II by the dielectric material (12) (FIG. 2E).

Figure 2E:
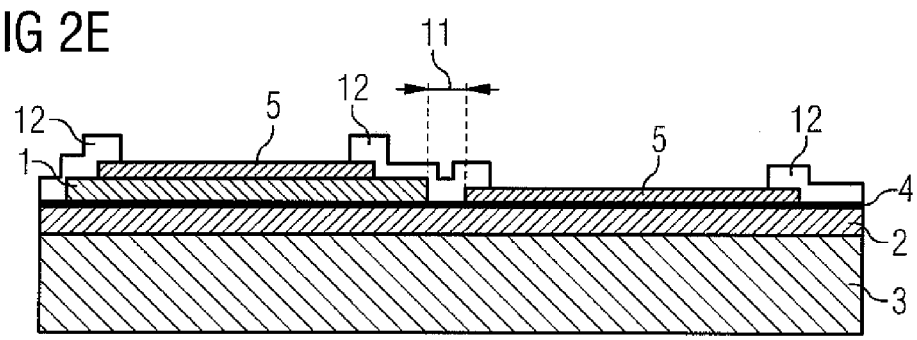
Figure 2F:
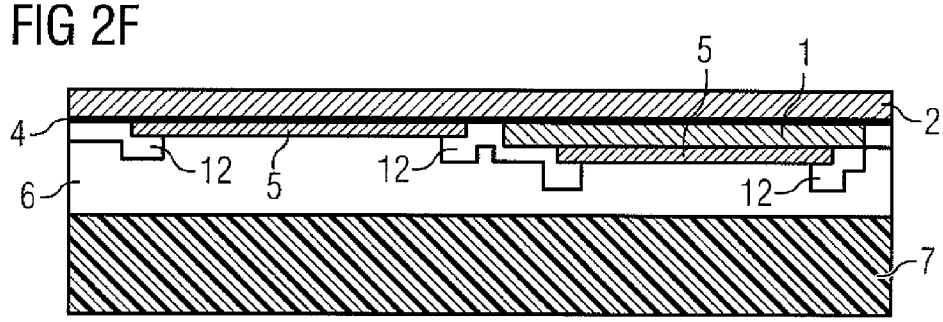

To simplify transfer of the assembly illustrated in FIG. 2E to a carrier 7, a levelling contact layer 6 is applied on the opposite side from the growth substrate. This may serve at the same time as a solder layer for attaching the assembly to the carrier 7. As soon as the assembly is attached to the carrier 7, the growth substrate 3 may be detached (FIG. 2F).

Figure 2G:
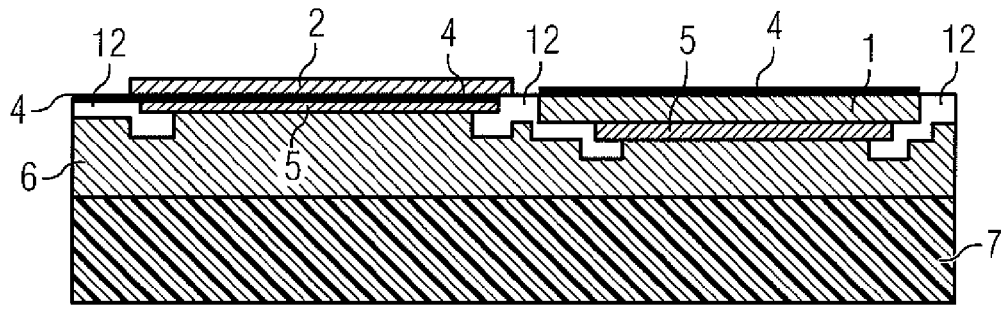

On the side of the detached growth substrate 3 the second active zone 2 is now uncovered and may therefore be straightforwardly structured from the side of the original growth substrate (FIG. 2G). The second active zone 2 and the first active zone 1 are thus structured on two mutually opposing sides.

Figure 2H:
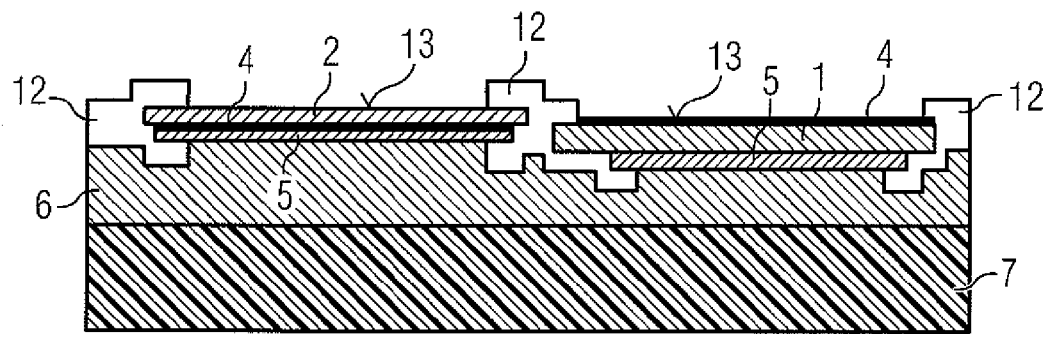

As is shown in FIG. 2H, the two active zones 1 and 2 may also be embedded into the dielectric material 12 at the side surfaces on the opposite side from the carrier 7, such that they are covered at the side faces and in part on the major faces 13 opposite the carrier 7 by the dielectric material 12.

Figure 2I:
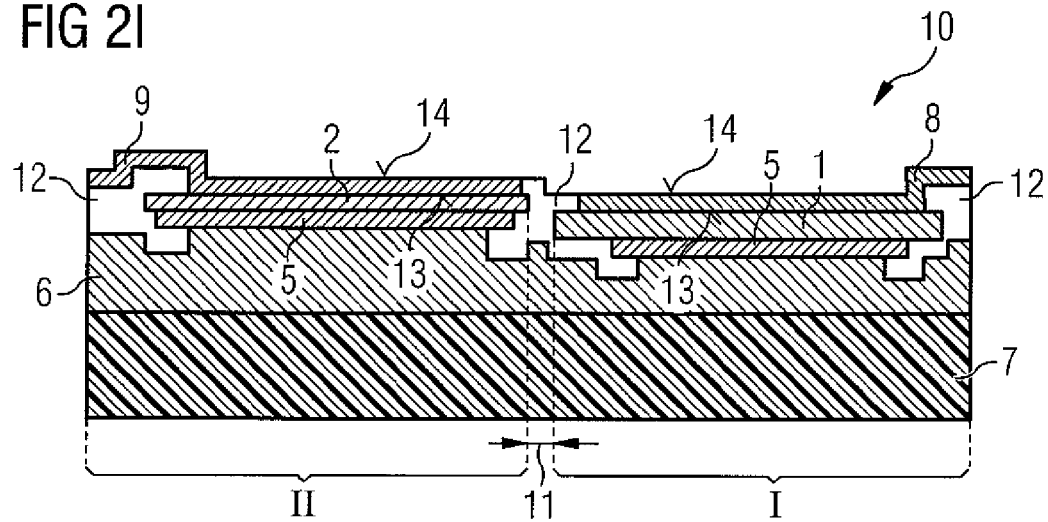

Finally, current spreading layers 14 may be applied to the uncovered major faces 13 of the two active zones 1 and 2, which layers 14 ensure homogeneous current distribution over the two active zones 1 and 2. Preferably, the two current spreading layers 14 contain or consist of a TCO. The two current spreading layers 14 and thus the two active zones 1 and 2 are in each case electrically contactable on the opposite side from the carrier by means of contact metallizations 8 and 9 (FIG. 2I). A common electrical contact is formed on the carrier side by the contact layer 6.

The radiation-emitting thin film semiconductor chip 10 produced by the method according to FIGS. 2A to 2I thus comprises a first region I with a first active zone 1, a second region II, separated laterally from the first region I by a space 11, with a second active zone 2 which extends parallel to the first active zone 1 in a different plane, and a compensating layer 5, which is located in the second region II at the level of the first active zone 1, the compensating layer 5 not containing any semiconductor material.

The regions I and II are different functional regions and may exhibit the characteristics explained in connection with FIG. 1F. In addition, the materials mentioned in connection with FIGS. 1A to 1F may also be used in the method according to FIGS. 2A to 2I.

It should be pointed out that the radiation-emitting thin film semiconductor chip may also comprise more than two regions or more than two active zones. A large number of active zones may then accordingly be grown one over the other and structured in such a way that in each case one region comprises one active zone, which is separated from the other active zones. Advantageously, in each case two successive active zones are structured from two different sides.

Figure 3:
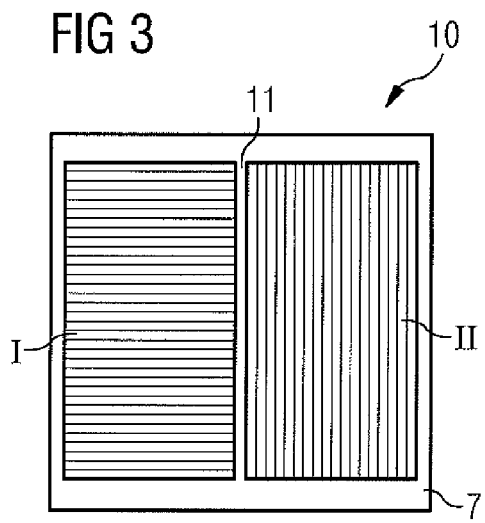
FIGS. 3 to 6 are schematic plan views of various exemplary embodiments of a thin film semiconductor chip.

FIG. 3 is a plan view of an advantageous embodiment of a thin film semiconductor chip 10, which is preferably produced according to one of the above-described methods. The thin film semiconductor chip 10 comprises a first region I and a second region II, which are separated from one another laterally by a space 11. The first region I is in particular intended to emit radiation of a first wavelength within the visible spectrum, while the second region II may be intended to emit radiation of a second wavelength within the visible spectrum. In this way, two different luminescent areas are produced by the two regions I and II when the thin film semiconductor chip 10 is in operation. An optical system arranged downstream of the semiconductor chip 10 may form a suitable image therefrom. Such a thin film semiconductor chip 10 may be used for example as a flashing display inside a vehicle.

Figure 4:
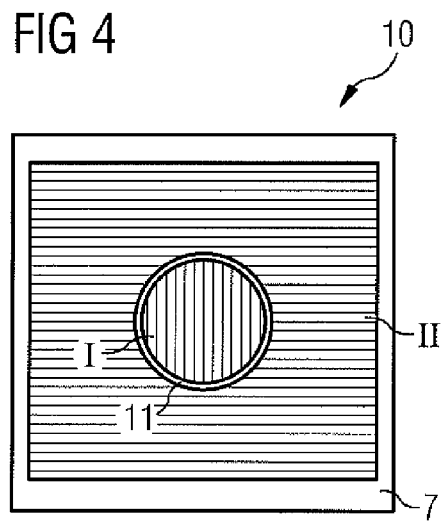
Figure 5:
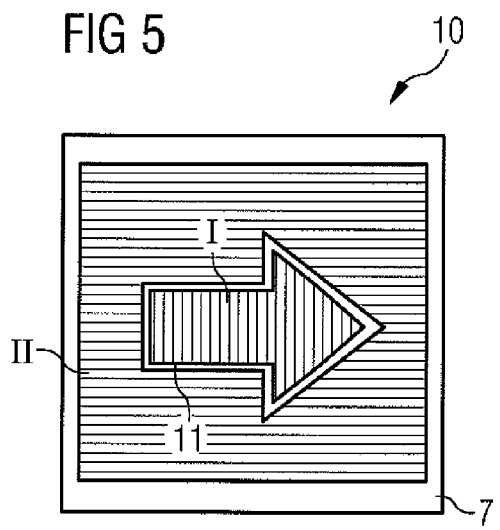

FIGS. 4 and 5 show further advantageous embodiments of a thin film semiconductor chip 10 which may be produced by one of the above-described methods. In these embodiments the first regions I take the form of symbols in the form of a circular area (FIG. 4) or of an arrow (FIG. 5). As a result of the colour contrast between the first region I and the second region II the symbols become visible to an observer when an image is appropriately formed and may be used for example as orientation aids in buildings.

In the case of the radiation-emitting thin film semiconductor chip 10 shown in FIG. 6, the first region I is a radiation-producing region and the second region II a protection region. The two regions I and II do not comprise any separate contact metallizations, but rather are jointly electrically contactable by means of a contact structure 15 electrically connecting the two regions I and II on the opposite side from the carrier. Since a contact layer (not shown) preferably connects the two regions I and II electrically on the carrier side, the two regions I and II are connected in parallel.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method of producing a radiation-emitting thin film semiconductor chip, comprising the steps of:
   growing a second active zone on a growth substrate;
   growing a first active zone on the second active zone;
   removing the first active zone in a second region;
   detaching the entire growth substrate; and
   removing the second active zone in a first region such that the first and second regions are separated from one another laterally by a space;
   wherein the first and the second active zones are removed by etching;
   wherein an etch stop layer is arranged between the first and second active zones, up to which the first active zone is etched away in the second region and the second active zone in the first region; and
   wherein the second active zone in the first region is etched after flipping the thin film semiconductor chip around.

2. A method according to claim 1, wherein after removal of the first active zone in the second region a compensating layer is arranged on the second active zone.

3. The method according to claim 1, wherein a carrier is arranged on the opposite side of the thin film semiconductor chip from the growth substrate before detachment of the growth substrate.

* * * * *